US012652056B2

(12) United States Patent
    Zhu et al.

(10) Patent No.: US 12,652,056 B2
(45) Date of Patent: Jun. 9, 2026

(54) ANALOG-TO-DIGITAL CONVERTER METASTABILITY ADJUSTMENT

(71) Applicant: Analog Devices, Inc., Wilmington, MA (US)

(72) Inventors: Haiyang Zhu, Winchester, MA (US); Tao Conrad, Bedford, MA (US)

(73) Assignee: Analog Devices, Inc., Wilmington, MA (US)

( * ) Notice: Subject to any disclaimer, the term of this patent is extended or adjusted under 35 U.S.C. 154(b) by 141 days.

(21) Appl. No.: 18/797,124

(22) Filed: Aug. 7, 2024

(65) Prior Publication Data

US 2026/0045954 A1      Feb. 12, 2026

(51) Int. Cl.
    *H03M 1/06*          (2006.01)
(52) U.S. Cl.
    CPC .................................. *H03M 1/0604* (2013.01)
(58) Field of Classification Search
    USPC .......................................................... 341/118
    See application file for complete search history.

(56) References Cited

U.S. PATENT DOCUMENTS 6,222,476 B1 * 4/2001 Lee ..................... H03M 1/0863
                                                         341/159
7,623,051 B2 * 11/2009 Murden .............. H03M 1/0809
                                                         341/120

| | | | |
|---|---|---|---|
| 8,872,691 B1 * | 10/2014 | Stepanovic | ............. H03M 1/06 |
| | | | 341/158 |
| 8,957,802 B1 * | 2/2015 | Evans | ................. H03M 1/0863 |
| | | | 341/161 |
| 9,484,945 B1 * | 11/2016 | Wan | ..................... H03M 1/0863 |
| 10,044,364 B1 * | 8/2018 | Sharif | ................... H03M 1/468 |
| 10,608,655 B1 * | 3/2020 | Li | ........................ H03M 1/1057 |
| 11,967,967 B2 * | 4/2024 | Liu | ........................ H03M 3/352 |
| 2018/0183459 A1 * | 6/2018 | Breems | ................. H03M 3/412 |
| 2021/0297087 A1 * | 9/2021 | Bandyopadhyay | ... H03M 1/125 |

\* cited by examiner

*Primary Examiner* — Jean B Jeanglaude
(74) *Attorney, Agent, or Firm* — Schwegman Lundberg & Woessner, P.A.

(57)                    ABSTRACT

A system for adjusting a metastability error in an analog-to-digital converter (ADC) can include a first metastability test circuit, which can be configured to determine whether a comparator can be in a first stage of the ADC has settled to a determinate binary state at a first time. The system can also include a second metastability test circuit, which can be configured to determine whether the comparator in the first stage of the ADC has settled to the determinate binary state at a second time, where the first time can be a first specified time period before the second time. The system can also include correction circuitry, which can be configured to adjust an output of the first stage when one or more of the first metastability test circuit or the second metastability test circuit determines that the comparator in the first stage has not settled to the determinate binary state.

20 Claims, 10 Drawing Sheets

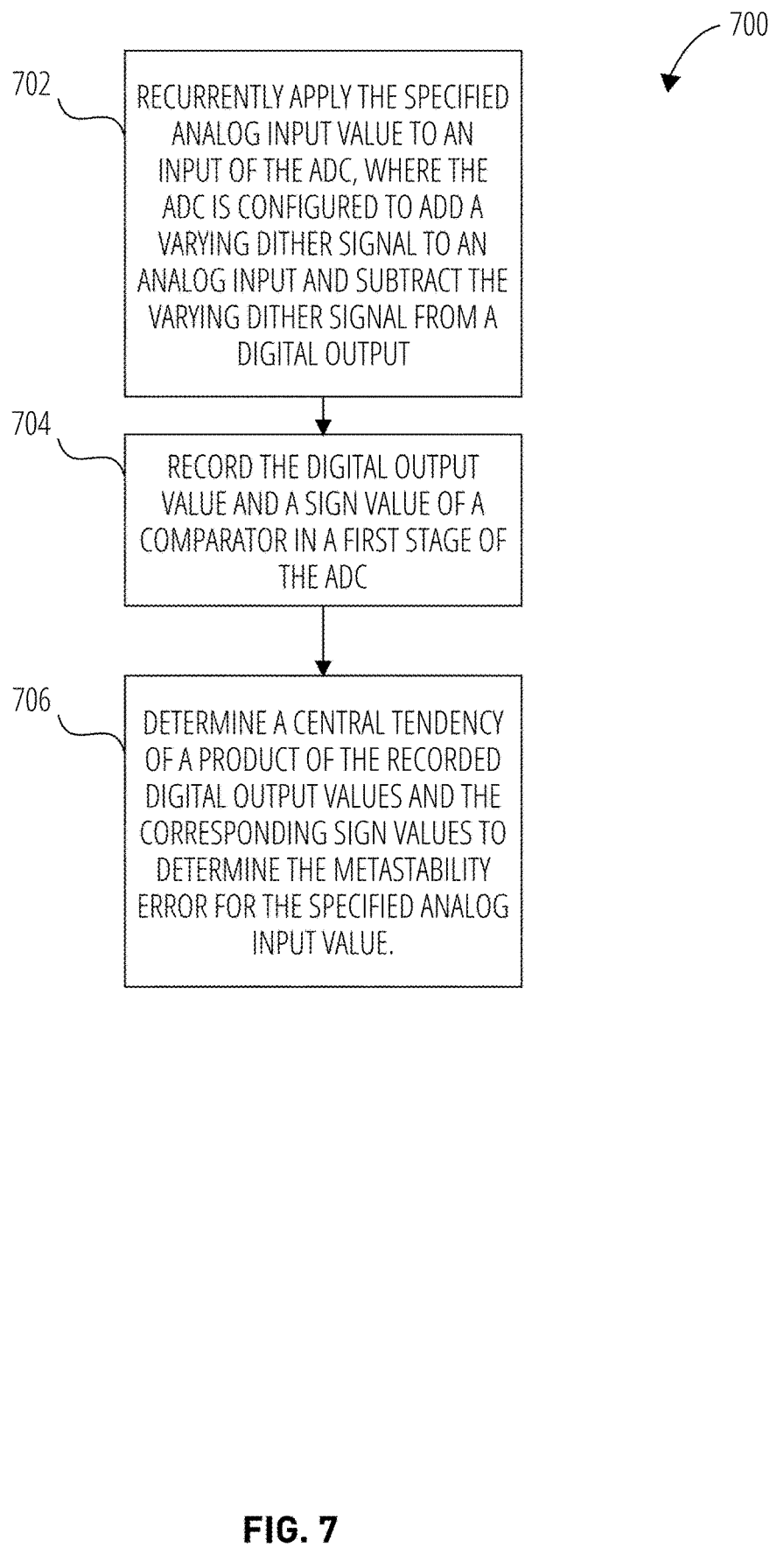

700

702 — RECURRENTLY APPLY THE SPECIFIED ANALOG INPUT VALUE TO AN INPUT OF THE ADC, WHERE THE ADC IS CONFIGURED TO ADD A VARYING DITHER SIGNAL TO AN ANALOG INPUT AND SUBTRACT THE VARYING DITHER SIGNAL FROM A DIGITAL OUTPUT

704 — RECORD THE DIGITAL OUTPUT VALUE AND A SIGN VALUE OF A COMPARATOR IN A FIRST STAGE OF THE ADC

706 — DETERMINE A CENTRAL TENDENCY OF A PRODUCT OF THE RECORDED DIGITAL OUTPUT VALUES AND THE CORRESPONDING SIGN VALUES TO DETERMINE THE METASTABILITY ERROR FOR THE SPECIFIED ANALOG INPUT VALUE.

FIG. 7

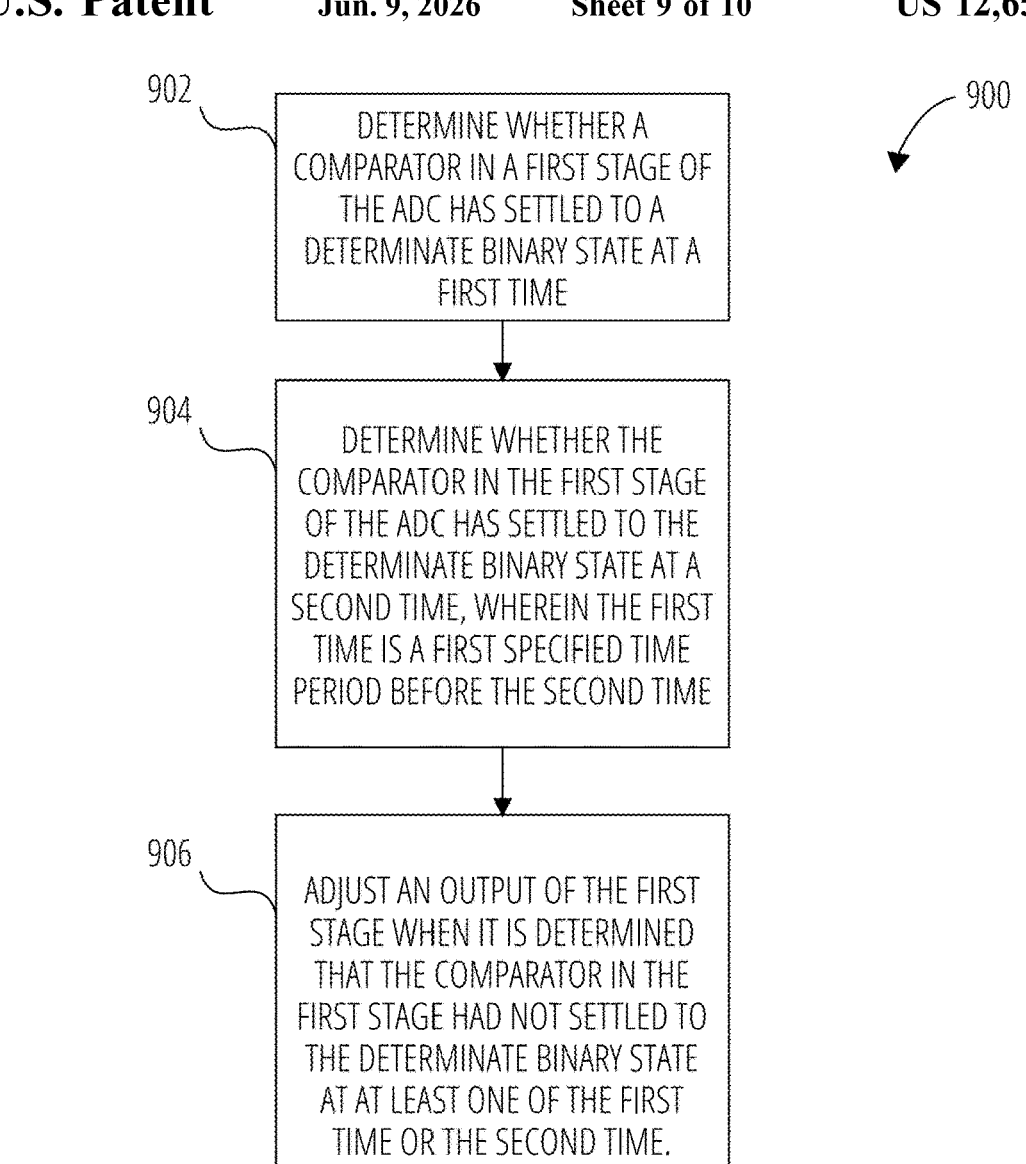

902

DETERMINE WHETHER A COMPARATOR IN A FIRST STAGE OF THE ADC HAS SETTLED TO A DETERMINATE BINARY STATE AT A FIRST TIME

904

DETERMINE WHETHER THE COMPARATOR IN THE FIRST STAGE OF THE ADC HAS SETTLED TO THE DETERMINATE BINARY STATE AT A SECOND TIME, WHEREIN THE FIRST TIME IS A FIRST SPECIFIED TIME PERIOD BEFORE THE SECOND TIME

906

ADJUST AN OUTPUT OF THE FIRST STAGE WHEN IT IS DETERMINED THAT THE COMPARATOR IN THE FIRST STAGE HAD NOT SETTLED TO THE DETERMINATE BINARY STATE AT AT LEAST ONE OF THE FIRST TIME OR THE SECOND TIME.

ANALOG-TO-DIGITAL CONVERTER METASTABILITY ADJUSTMENT

TECHNICAL FIELD

The present disclosure relates to electronics, and more particularly, but not by way of limitation, to a system for adjusting a metastability error of an analog-to-digital converter (ADC).

BACKGROUND

Modern systems can use ADCs to convert an analog signal into a digital signal for processing, storage, or communication. Examples of such modern systems include communication systems, radar systems, measuring systems, and monitoring systems. In these and other modern systems, the accuracy of the ADC may be of interest. Increased accuracy may be helped by calibrating an ADC.

SUMMARY

In an example, a system for adjusting a metastability error in an analog-to-digital converter (ADC) can include a first metastability test circuit, which can be configured to determine whether a comparator can be in a first stage of the ADC has settled to a determinate binary state at a first time. The system can also include a second metastability test circuit, which can be configured to determine whether the comparator in the first stage of the ADC has settled to the determinate binary state at a second time, where the first time can be a first specified time period before the second time. The system can also include correction circuitry, which can be configured to adjust an output of the first stage when one or more of the first metastability test circuit or the second metastability test circuit determines that the comparator in the first stage has not settled to the determinate binary state.

In an example, a method for adjusting a metastability error in an analog-to-digital converter (ADC) can include determining whether a comparator in a first stage of the ADC has settled to a determinate binary state at a first time. The method can also include determining whether the comparator can in the first stage of the ADC has settled to the determinate binary state at a second time, where the first time can be a first specified time period before the second time. The method can also include adjusting an output of the first stage when it is determined that the comparator in the first stage had not settled to the determinate binary state at one or more of the first time or the second time.

In an example, a method for determining a metastability error in an analog-to-digital converter (ADC) can include calculating the metastability error for a specified analog input value by recurrently applying the specified analog input value to an input of the ADC, where the ADC can be configured to add a varying dither signal to an analog input and subtract the varying dither signal from a digital output. The method can also include recurrently recording the digital output value and a sign value of a comparator in a first stage of the ADC. The method can also include determining a central tendency of a product of the recorded digital output values and the corresponding sign values to determine the metastability error for the specified analog input value.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

FIG. 7 shows an example of portions of a method for determining a metastability error.

FIG. 9 shows an example of portions of a method for operating a system for adjusting a metastability error.

DETAILED DESCRIPTION

An ADC can convert the received analog input signal to a digital output signal with a specified degree of accuracy, precision, or both. One or more errors can affect this accuracy or precision, such as can include a metastability error. A metastability error can arise due to a circuit configuration, and can result in an error in the output of the ADC. A metastability error can be caused at least in part by the decision time (e.g., settling time) of a circuit, such as a comparator.

The present inventors have recognized, among other things, that a metastability error can include a predictable component (e.g., when the metastability error occurs, the error is of a substantially consistent magnitude). For example, there can be a mapping, such as a 1:1 mapping between the decision time of a comparator and the metastability error. In an example, the decision time can be determined (e.g., measured, detected, estimated, calculated), and then the metastability error can be adjusted (e.g., corrected).

The present inventors have recognized, among other things, systems and methods for one or more of detecting a metastability error in an ADC, estimating a metastability error in an ADC, or adjusting (e.g., correcting) a metastability error in an ADC.

Figure 1:
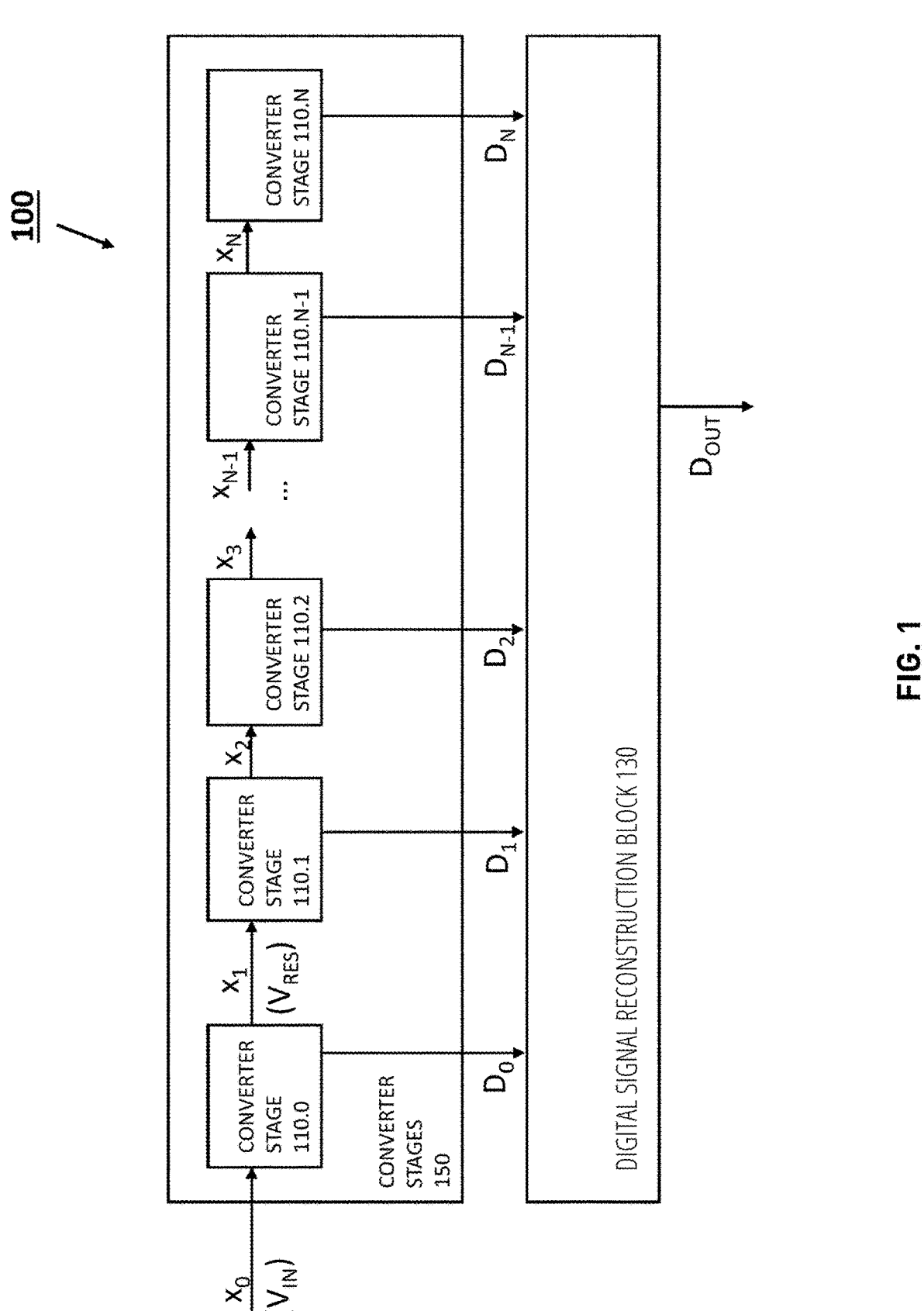
FIG. 1 show an example of portions of a block diagram of a residue-generating ADC.

FIG. 1 shows an example of portions of a block diagram of a residue-generating ADC 100. The residue-generating ADC 100 can include converter stages 150 and digital signal reconstruction block 130. Residue-generating ADCs can be or can include pipelined ADCs.

The converter stages 150 (e.g., stages) can include a plurality of converter stages 110.0-110.N (or N+1 stages), connected in series, in pipeline, or in a cascading configuration. Each converter stage (referred to herein as a stage) may receive a respective analog input signal ("$x_0$", "$x_1$", "$x_2$", "$x_3$" . . . "$x_{N-1}$", and "$x_N$"), and may generate a respective analog output signal ("$x_1$", "$x_2$", "$x_3$" . . . "$x_{N-1}$", and "$x_N$") and a respective digital output signal ("Do", "$D_1$", "$D_2$", "$D_3$" . . . "$D_{N-1}$", and "$D_N$"). The respective analog output signals can be residues of the respective converter stages, formed by summation/subtraction of the analog input signal to the converter stage and an analog signal reconstructed from the digital output signal (e.g., $x_1$ can be a residue signal of converter stage 110.0).

The converter stages 150 can have respective bits of digital resolution ("$N_0$", "$N_1$", "$N_2$", "$N_3$" . . . "$N_{N-1}$", and "$N_N$"). The converter stages 150 can have the same number of bits of digital resolution, or the converter stages 150 can have different numbers of bits of digital resolution. Each converter stage may generate respective digital output signals, which may be combined to form an overall digital output signal $D_{OUT}$ for the residue-generating ADC 100. The digital output signals (e.g., "$D_0$", "$D_1$", "$D_2$", "$D_3$" . . . "$D_{N-1}$", and "$D_N$") can be provided to a digital signal reconstruction block 130, which can combine and/or filter the respective digital output signals and form the final converter digital output signal $D_{OUT}$ representing the analog input signal $x_0$.

For simplicity, some signal paths may not be shown. For instance, in some cases, one or more converter stages may receive other analog input signals (e.g., analog input signals of the previous stages and/or analog input signals of subsequent stages).

The stages of the residue-generating ADC 100 can be implemented with the same kind of converter architecture, or a combination of different converter architectures. Possible converter architectures (e.g., characterized by the type of quantizer used in the stage) can include: DS modulation (e.g., as multi-stage noise shaping (MASH) ADCs), Flash conversion (e.g., as can be used in pipelined ADCs), successive approximation register (SAR) conversion, and voltage-controlled-oscillator-based (VCO-based) conversion.

Figure 2:
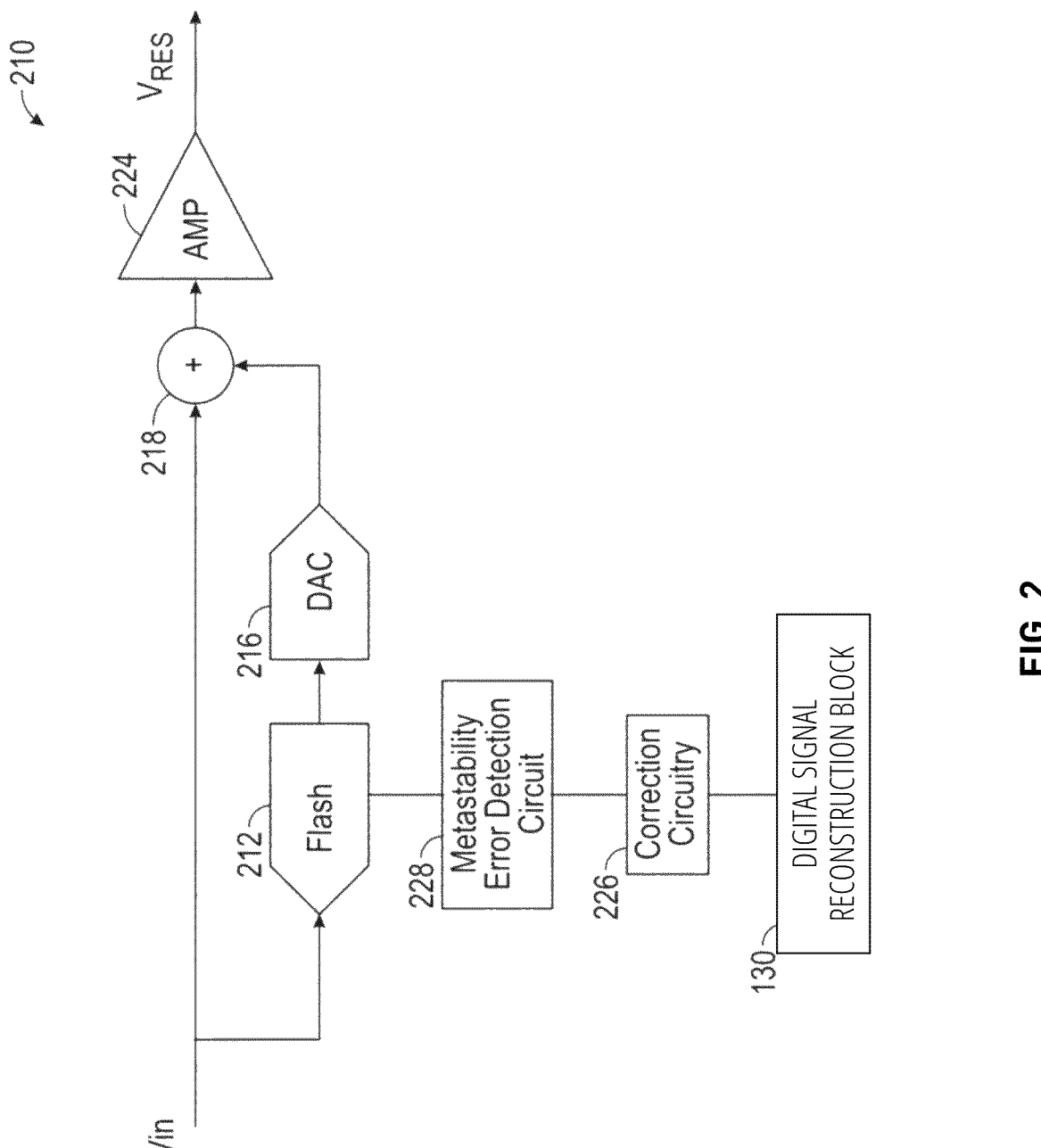
FIG. 2 shows an example of portions of first stage of a residue-generating ADC.

FIG. 2 shows an example of portions of first stage 210 of a residue-generating ADC. $V_{IN}$ can be continuous-time (not sampled) and/or continuous-value (not quantized) analog input signal to the first stage. $V_{IN}$ can be any time of input. $V_{RES}$ can be the first stage's analog output signal (e.g., the residue signal). Do can be the first stage 210's $N_0$-bit digital output signal. $V_{RES}$ can be provided to the second stage which can follow the first stage 210.

The first stage 210 can resolve and output a digital output signal, which can include the $N_0$-bit digital output $D_0$. $D_0$ can contribute to the most significant bits of final converter digital output signal $D_{OUT}$. $D_0$ can include redundant bits. $D_0$ can be generated by quantizing the input $V_{IN}$ with a sub-ADC (or quantizer) 212, depicted in FIG. 2 as a clocked flash ADC. While a flash ADC can be used, other clocked quantizers could be used as the sub-ADC 212. The sub-ADC 212 can perform two functions: sampling and quantization.

The sub-ADC 212 can be clocked by a clock signal, having a constant sampling frequency $f_s$. Accordingly, the digital output signal (e.g., the quantized No-bit Do) at the sub-ADC 212's output can be uniformly-sampled in time. This digital output signal $D_0$ can be sign-inverted and converted into a uniformly-sampled, level-quantized, continuous analog output by sub-DAC (e.g., a multiplying DAC (MDAC)) 216. While an MDAC can be used as the sub- DAC 216, other DACs could also be used, such as can include current steering DACs, resistor string DACs, or switched-capacitor DACs. The sub-ADC 212 and sub-DAC 216 can be controlled by the same clock signal (or two slightly phase-shifted copies of the same clock signal) at sampling frequency $f_s$. At summing node 218, the inverted analog (reconstructed) representation of the first stage 210's quantized and sampled digital output signal $D_0$ of $V_{IN}$ (e.g., a coarsely digitized $V_{IN}$) and $V_{IN}$ can be summed.

The first stage 210's analog output signal $V_{RES}$, can be obtained by amplifying the output of the summing node 218 using the amplifier 224. This can include the sum of the inverted analog (reconstructed) representation of the first stage 210's quantized and sampled digital output signal $D_0$ of $V_{IN}$ (e.g., a coarsely digitized $V_{IN}$) and $V_{IN}$. The signal at the summing node 218 can be provided to an amplifier 224 which can generate the analog output signal $V_{RES}$. The amplifier 224 can provide amplification or gain as needed for the next stage. The analog output signal $V_{RES}$ constitutes the first stage 210's residue signal. The residue signal $V_{RES}$ represents a residual part of the input voltage $V_{IN}$ which can be subsequently quantized by the following stages of the pipelined ADC, such as a second stage, such as so that a finer quantization of $V_{IN}$ can be obtained. $V_{RES}$ can be fed to the second stage to resolve additional less significant bits of the final converter digital output signal $D_{OUT}$.

The first stage 210 can also include a metastability error detection circuit 228, which can be configured to detect if a metastability error has occurred in a conversion. The metastability error detection circuit 228 is discussed with more detail below with respect to FIG. 4). The first stage 210 can also include an adjustment circuitry 226, which can be configured to estimate a metastability error, correct for a metastability error, or both. The adjustment circuitry 226 is discussed with more detail below, such as with respect to FIG. 5A to FIG. 8C). The second and following stages (e.g., if used) can be constructed similarly to the first stage 210, or can differ in one or more ways. One or more of the other stages can include a metastability error detection circuit 228, an adjustment circuitry 226, or both, or can share the metastability error detection circuit 228 and the adjustment circuitry 226. In an example, one or more of the other stages need not include a detection circuit 228, a correction circuitry 226, or both, with one or more other stages.

Figure 3:
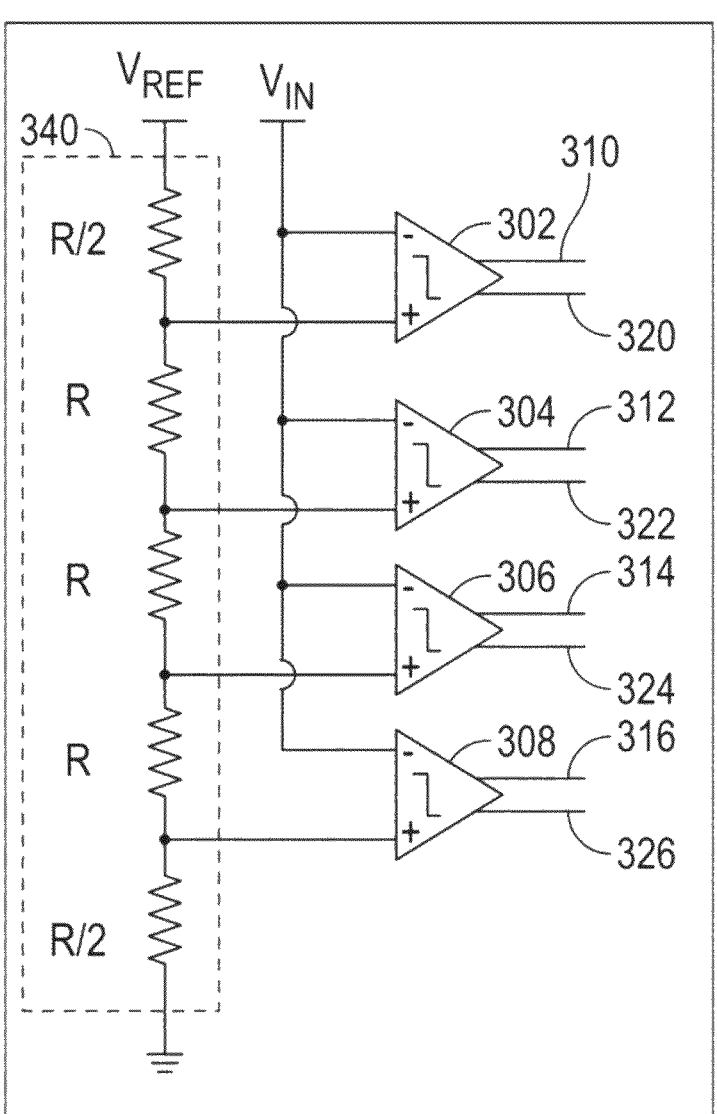
FIG. 3 shows an example of portions of a residue-generating ADC including an example of portions of a sub-ADC.

FIG. 3 shows an example of portions of a residue-generating ADC 100 including an example of portions of a sub-ADC 212. The sub-ADC 212 can be configured for generating a binary output signal based on the analog input signal $V_{IN}$. In the example of FIG. 3, the sub-ADC 212 can include a 2-bit DAC. The output of the sub-ADC 212 can be sent to the digital signal reconstruction block 130. FIG. 3 shows that the sub-ADC 212 can include one or more comparators (e.g., a flash ADC), and voltage divider circuitry 340.

The voltage divider circuitry 340 can be configured to divide an input voltage reference VREF into two or more differing voltage levels for comparison to the input signal $V_{IN}$. In the example of FIG. 3, the voltage divider circuitry 340 can generate four voltage levels, which can include nominal values of $\frac{1}{8}V_{IN}$, $\frac{3}{8}V_{IN}$, $\frac{5}{8}V_{IN}$, and $\frac{7}{8}V_{IN}$. These voltage levels can be configured to provide the sub-ADC 212 with a linear 2-bit digital output.

The sub-ADC 212 can include a first comparator 302, a second comparator 304, a third comparator 306, and a fourth comparator 308. The plurality of comparators can be configured to receive a reference voltage from the voltage divider circuitry 340 and compare the reference voltage to $V_{IN}$. If the reference voltage received by the comparator is less than $V_{IN}$, the comparator can generate a logical high value on the positive output. The first comparator 302 can include a first positive output 310, the second comparator 304 can include a second positive output 312, the third comparator 306 can include a third positive output 314, and the fourth comparator 308 can include a fourth positive output 316. If the reference voltage received by the comparator is greater than Vin, the comparator can generate a logical high value on the negative output. The first comparator 302 can include a first negative output 320, the second comparator 304 can include a second negative output 322, the third comparator 306 can include a third negative output 324, and the fourth comparator 308 can include a fourth negative output 326.

The comparators can be configured to be reset, such as with a reset input. After being reset, both the positive output and the negative output can be logical low values. Following being reset, the comparator can begin comparing the received reference voltage to $V_{IN}$. The positive output and the negative output can remain as logical low values until the comparator decides (e.g., determines which input is greater). This can take a length of time (e.g., the decision time) that varies based on the difference between the inputs (e.g., the closer the inputs are, the longer it can take to decide).

When a comparator takes longer than a specified length of time to decide (e.g., settle to a determinate binary state), a metastability error can result. For example, the residue-generating ADC 100 can begin using data from a comparator that has not decided (e.g., entered a determinate binary state, such as a steady state). The longer the comparator takes to decide, the closer input signal is to the reference value, or both (e.g., because the comparator can take longer to decide when the input signal is closer to the reference value), the greater the metastability error can be (e.g., as shown with respect to FIG. 5A).

Figure 4:
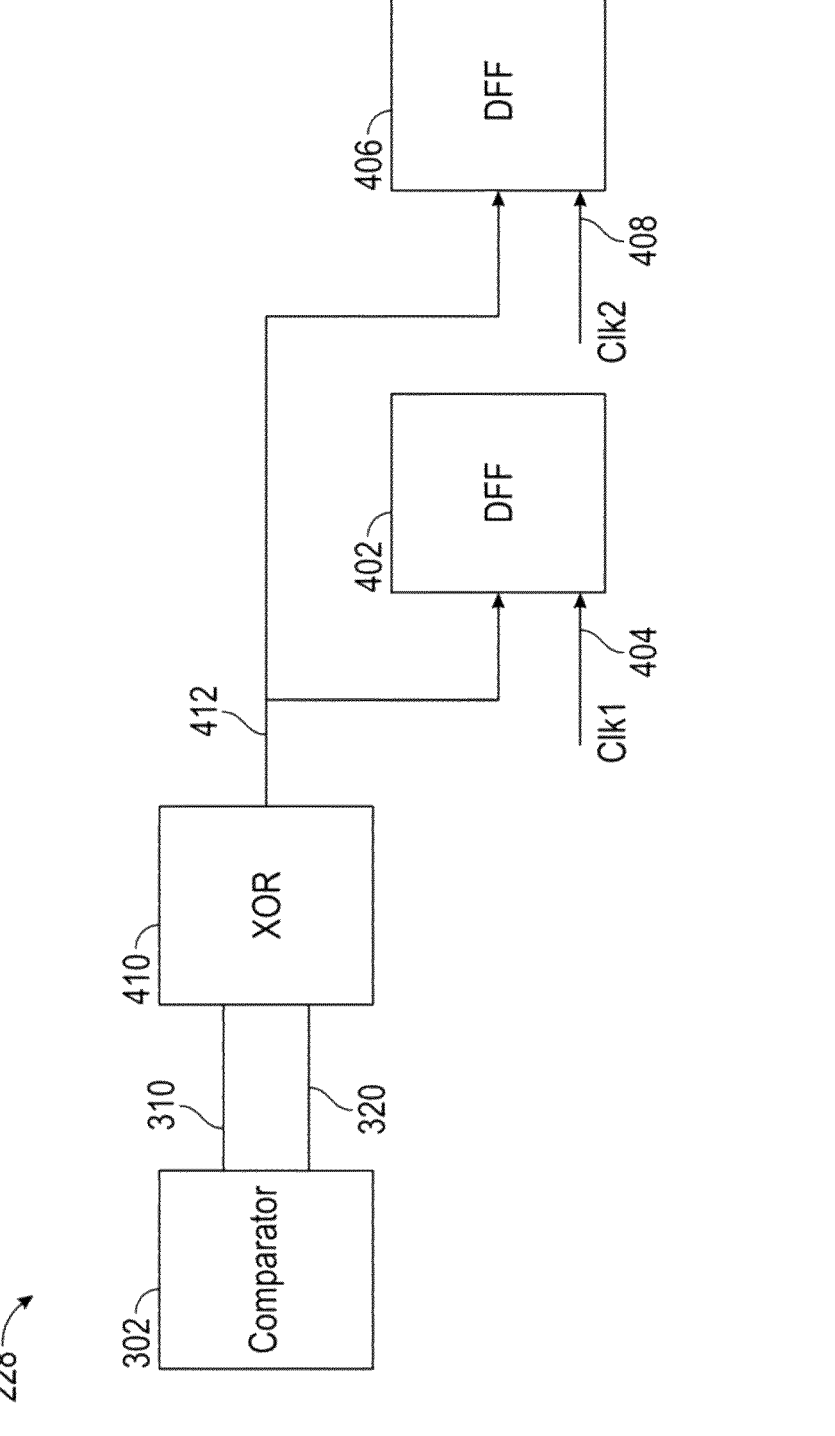
FIG. 4 shows an example of portions of a metastability error detection circuit.

FIG. 4 shows an example of portions of a metastability error detection circuit 228. The metastability error detection circuit 228 can be configured to detect a metastability error arising from the first comparator 302, such as discussed below. For example, each comparator in the sub-ADC 212 can include a metastability error detection circuit 228 (e.g., four metastability error detection circuits 228 in the sub-ADC 212). In an example, the metastability error detection circuit 228 can be configured to detect metastability error in one or more of the comparators in the first stage 210 (e.g., all of the comparators 302 through 308). The metastability error detection circuit 228 can include an XOR gate 410, a first metastability test circuit 402, and a second metastability test circuit 406.

The XOR gate 410 can receive the first positive output 310 and the first negative output 320 as inputs, and can generate an output on the output node 412. The output node 412 carrying a logical high value can indicate that the first comparator 302 has settled to a determinate state (e.g., one of the first positive output 310 or the first negative output 320 is high, and the other is low). If the output node 412 carries a logical low value, this indicates that the first comparator 302 has not decided (e.g., both of the first positive output 310 and the first negative output 320 are still a logical low value, such as after being reset), or is in an error state (e.g., both the first positive output 310 and the first negative output 320 are high).

The first metastability test circuit 402 can receive the signal on the output node 412, and record the value of the received signal when the clock signal on the first input clock signal node 404 goes high. This can allow the first metastability test circuit 402 to determine and/or record whether the first comparator 302 has decided at a first time when the signal on the first input clock signal node 404 goes high. In an example, the first metastability test circuit 402 can include a delay flip-flop. The delay flip-flop can be configured to capture the output value of the XOR gate based on the first input clock signal. In an example, the first metastability test circuit 402 can include the XOR gate 410.

The second metastability test circuit 406 can be configured similarly to the first metastability test circuit 402, except that the second metastability test circuit 406 can record the value of the received signal when the clock signal on the second input clock signal node 408 goes high. This can allow the second metastability test circuit 406 to determine and/or record whether the first comparator 302 has decided at a second time when the signal on the second input clock signal node 408 goes high. In an example, the second metastability test circuit 406 can include a delay flip-flop. In an example, the second metastability test circuit 406 can include the XOR gate 410. In an example, the first metastability test circuit 402 and the second metastability test circuit 406 can share the XOR gate 410. The first time can be a first specified time period before the second time.

In an example, the second metastability test circuit 406 might not be provided, and the metastability error detection circuit 228 might only detect the metastable state of the first comparator 302 at the first time (e.g., using the first metastability test circuit 402). In an example, one or more additional metastability test circuits can be provided to determine the metastable state of the first comparator 302 at one or more additional times. For example, the metastability error detection circuit 228 can include a third metastability test circuit, which can be configured to determine whether the first comparator 302 has settled to the determinate binary state at a fifth time. The fifth time can be a second specified time period after the second time. The adjustment circuitry 226 can be configured to adjust the output of the first stage 210 (e.g., the output sent to the digital signal reconstruction block 130) when one or more of the first metastability test circuit, the second metastability test circuit, or the third metastability test circuit determines that the comparator in the first stage has not settled to the determinate binary state.

In an example, the metastability error detection circuit 228 can include a fourth metastability test circuit. The fourth metastability test circuit can be configured to determine whether a comparator in a second stage of the ADC has settled to a determinate binary state at the first time, or another time. The metastability error detection circuit 228 can also include a fifth metastability test circuit. The fifth metastability test circuit can be configured to determine whether the comparator in the first stage of the ADC has settled to the determinate binary state at the second time, or another time.

The residue-generating ADC 100 can include second correction circuitry. The second correction circuitry can be configured to adjust an output of the second stage when one or more of the fourth metastability test circuit or the fifth metastability test circuit determines that the comparator in the second stage has not settled to the determinate binary state. The second correction circuitry can be configured similarly to the first correction circuitry, or can differ in one or more ways. In an example, one or more of the converter stages 150 can include one or more metastability error detection circuits 228, such as can be configured similarly to the metastability error detection circuit 228 discussed above, or can differ in one or more ways.

Figures 5A, 5B:
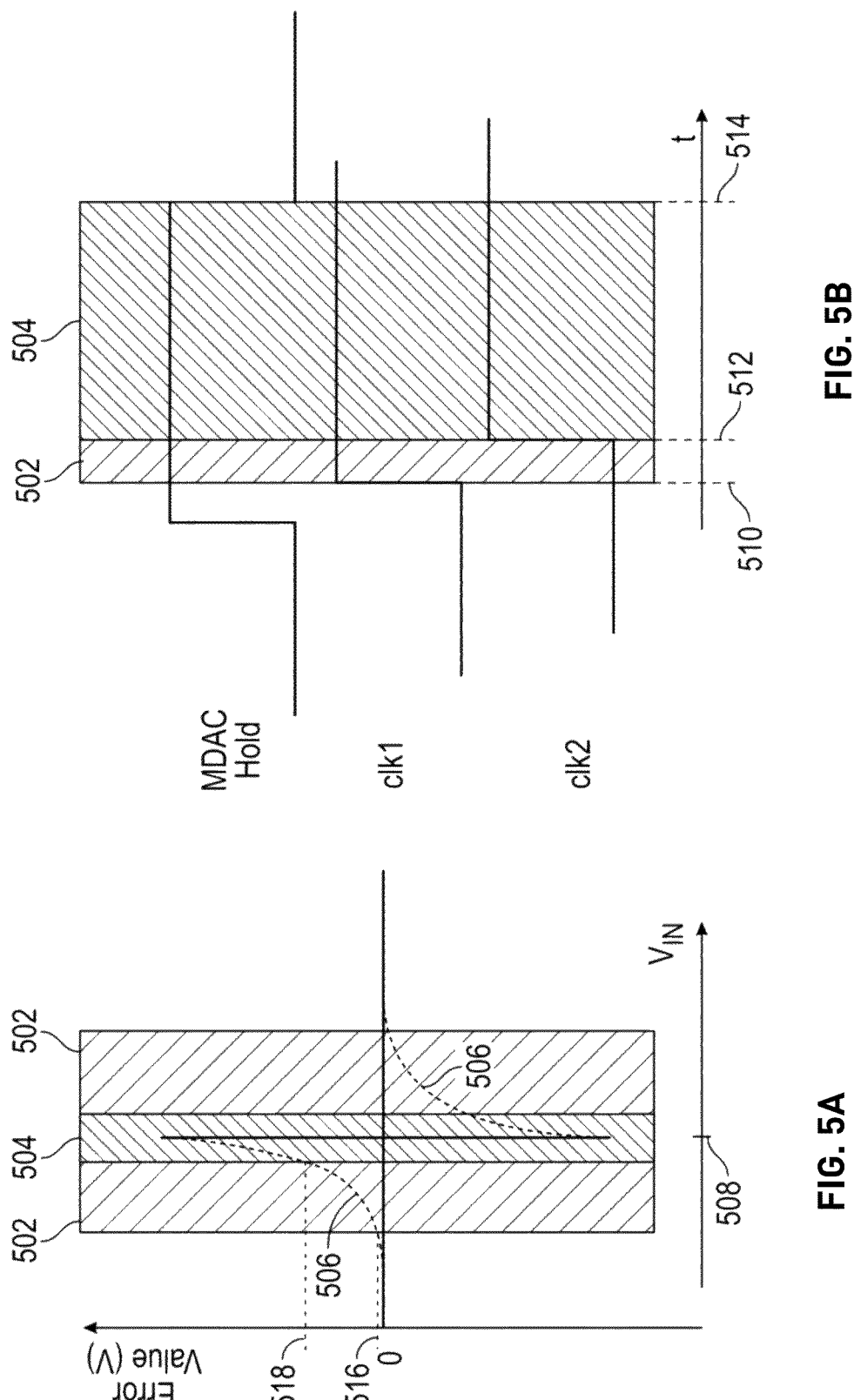
FIG. 5A shows an example of portions of metastability error of a comparator in a residue-generating ADC.
FIG. 5B shows an example of portions of metastability regions of a comparator in a residue-generating ADC.

FIG. 5A shows a theoretical example of portions of metastability error 506 of a comparator in a residue-generating ADC (e.g., the residue-generating ADC 100). The comparator can include the first comparator 302. FIG. 5A shows that the metastability error 506 can increase as the input voltage approaches the comparator threshold 508 (e.g., the reference voltage received by the comparator). The metastability error 506 can be substantially zero far from the comparator threshold 508, and can reach a maximum at the comparator threshold 508. The sign of the metastability error 506 can depend on the side of the comparator threshold 508 that the input voltage is on. A first metastable region 502 can be defined across a region where the metastability error 506 has a specified range of absolute values. A second metastable region 504 can be defined between the two regions of the first metastable region 502, can be defined across a region where the metastability error 506 has a specified range of absolute values, or both.

FIG. 5B shows an example of portions of metastability regions of a comparator in a residue-generating ADC. FIG. 5B shows that the first input clock signal (e.g., clk1) can go high at the first time 510. The second input clock signal (e.g., clk2) can go high at the second time 512. The sub-ADC 212 (e.g., the MDAC) can end its hold period at the third time 514. FIG. 5A and FIG. 5B show that the first time 510 can be selected to match a beginning of the first metastable region 502 and the second time 512 can be selected to match an end of the first metastable region 502, a beginning of the second metastable region 504, or both. The second metastable region 504 can end at the third time 514 (e.g., the end of the MDAC hold period can begin a new sample cycle, which can reset the comparator, such as can cap the metastability error).

The first time 510 can be selected based on when the metastability error 506 reaches a first specified threshold level 516 (e.g., the start of the first metastable region 502). The second time 512 can be selected based on when the metastability error 506 reaches a second specified threshold level 518 (e.g., the start of the second metastable region 504). The portion of the metastability error 506 beyond the comparator threshold 508 can be an inversion, reverse, or both, of the portion of the metastability error 506 before the comparator threshold 508.

Figure 6A:
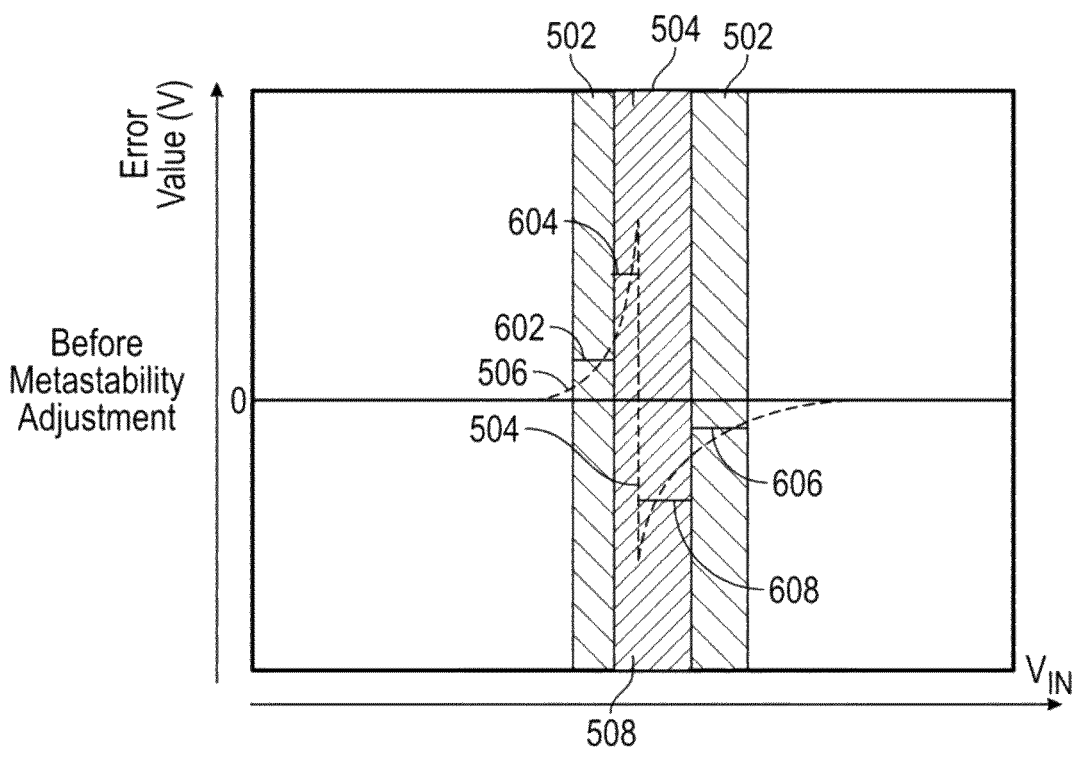
FIG. 6A shows an example of portions of metastability error of a comparator in a residue-generating ADC.

FIG. 6A shows an example of portions of metastability error 506 of a comparator (e.g., the first comparator 302) in a residue-generating ADC (e.g., the residue-generating ADC 100). The adjustment circuitry 226, can be configured to adjust an output (e.g., Do) of the first stage, such as when at least one of the first metastability test circuit or the second metastability test circuit determines that the comparator in the first stage has not settled to the determinate binary state. The adjustment circuitry 226 can adjust the output of the first stage 210 by providing an adjusted signal to the digital signal reconstruction block 130. For example, the digital output of the first stage 210 can be adjusted to account for the metastability error in the output. In an example, the adjustment circuitry 226 can be included in the metastability error detection circuit 228 or the digital signal reconstruction block 130. In an example, the adjustment circuitry 226 can adjust an output of the residue-generating ADC 100 (e.g., D_{out}), alternatively or in addition to adjusting the output of the first stage 210.

The correction circuitry can be configured to subtract a first metastability error correction value 602 from the output of the first stage 210, such as when the first metastability test circuit 402 determines that the comparator in the first stage 210 has not settled to the determinate binary state. The first metastability error correction value 602 can represent a central tendency (e.g., mean, median, mode) of the metastability error 506 between the first time 510 and the second time 512.

The correction circuitry can be configured to subtract a second metastability error correction value 604 from the output of the first stage 210 when the second metastability test circuit 406 determines that the comparator in the first stage 210 has not settled to the determinate binary state. The second metastability error correction value 604 can represent a central tendency of the metastability error between the second time 512 and a third time 514. In an example, when the second metastability test circuit 406 determines that the comparator in the first stage 210 has not decided, the first metastability test circuit 402 can also determine that a comparator in the first stage 210 has not decided. In this example, the second metastability error correction value 604 can be subtracted from the output alternatively or in addition to the first metastability error correction value 602.

FIG. 6A shows the metastability error 506, such as can be similar to FIG. 5A. FIG. 6A also shows the first metastability error correction value 602, which can be the average of the metastability error 506 within the first metastable region 502. The second metastability error correction value 604 can be the average of the metastability error 506 within the second metastable region 504. The first metastability error correction value 602 can represent the central tendency of the absolute value (e.g., all negative values converted to positive) of the metastability error 506 within the first metastable region 502. The second metastability error correction value 604 can represent the central tendency of the absolute value of the metastability error 506 within the second metastable region 504. For voltage inputs above the comparator threshold 508, the sign value of the error can be recovered by inverting the first metastability error correction value 602, the second metastability error correction value 604, or both, such as can generate one or more of the sign-corrected first metastability error correction value 606 or the sign corrected second metastability error correction value 608. In an example, subtracting the first metastability error correction value 602 from the output of the first stage 210 can include subtracting the first metastability error correction value 602 or the sign corrected first metastability error correction value 606 as appropriate (e.g., based on the proper sign corrected value).

Figure 6B:
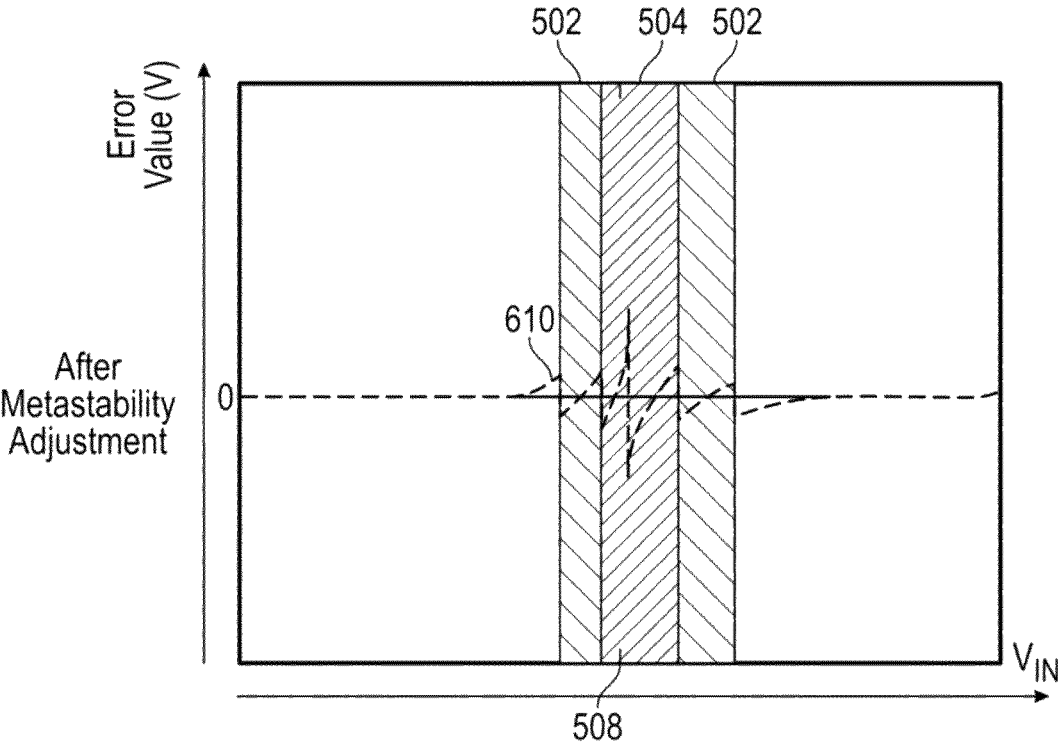
FIG. 6B shows an example of portions of a adjusted metastability error of a comparator in a residue-generating ADC.

FIG. 6B shows an example of portions of an adjusted metastability error 610 of a comparator in a residue-generating ADC 100. In an example, the adjusted metastability error 610 can include a corrected metastability error value. The adjusted metastability error 610 can be the result of the adjustment circuitry 226 subtracting the first metastability error correction value 602 (e.g., the sign corrected first metastability error correction value 602) from the metastability error 506 when the first metastability test circuit 402 indicates that the comparator has not decided and the second metastability error correction value 604 (e.g., the sign corrected second metastability error correction value 604) from the metastability error 506 when the second metastability test circuit 406 indicates that the comparator has not decided.

One or more of the first time 510 or the second time 512 can be selected to increase a signal-to-noise ratio of an output of the ADC. This can include determining the signal-to-noise ratio for two or more values of one or more of the first time or the second time, such as using one or more of a computer model or a physical test circuit.

FIG. 7 shows an example of portions of a method 700 for determining a metastability error in an analog-to-digital converter (ADC), such as the residue-generating ADC 100. The method 700 can be performed by a system for adjusting a metastability error in an analog-to-digital converter (ADC), such as the residue-generating ADC 100.

The metastability error 506 can be specified, estimated, calibrated, or measured. In an example, the metastability error for a specified analog input value can be calculated, such as calculated by the adjustment circuitry 226. The metastability error can be calculated during operation (e.g., at run-time) or prior to operation, such as during a factory calibration. Calculating the metastability error for a specified analog input value can include one or more of the steps in the method 700. At step 702, the specified analog input value can be recurrently (e.g., such as two or more times, periodically) applied to the input of the residue-generating ADC 100. The residue-generating ADC 100 can be configured to add a varying dither signal to an analog input and subtract the varying dither signal from the digital output.

At step 704, the digital output value of the residue-generating ADC 100 can be recorded (e.g., recorded for each iteration). The sign value (e.g., the sign value can be positive hen the positive output is high and the sign value can be negative when the negative output is high) of the comparator can be recorded.

At step 706, a central tendency (e.g., average, mean, mode) of a product of the recorded digital output values and the corresponding sign values can be determined. The result can be the metastability error for the specified analog input value.

A mathematical representation of a portion of steps step 706 is shown below in equations 1 through 3.

$$Avg((V + e + \text{dither} - \text{dither}) * Sgn(V + \text{dither})) \qquad \text{Equation 1}$$

$$Avg(V * Sgn(V + \text{dither})) + Avg(e * Sgn(V + \text{dither})) \qquad \text{Equation 2}$$

$$Avg(e * Sgn(V + \text{dither})) = \text{Abs}(e) \qquad \text{Equation 3}$$

Equations 1 through 3 can all have an equal value (e.g., equations 1 through 3 can be equated to each other). In equations 1 through 3, Avg can represent the average function, or another central tendency, Abs can represent the absolute value function, Sgn can represent the sign function (e.g., return a +1 if the operand is positive, a 0 if the operand is 0, or a −1 if the operand is negative), V can represent the specified analog input value, the digital representation of the specified analog input value, or both, e can represent the metastability error, and dither can represent the value of the varying dither signal.

Equation 1 shows that the digital output value (e.g., recorded at step 704) can have a value equal to (V+e+dither−dither) which can equal to (V+e) as the dither input to the analog signal can be cancelled out from the digital signal. This shows that the digital output can be the digital representation of the specified analog input value plus the metastability error.

Equation 2 can show a manipulation of equation 1. Avg(V*Sgn(V+dither)) can be equal to zero, because the dither signal can make the sign value of the input voltage uncorrelated to the sign value of the comparator. For example, the specified analog input value combined with the varying dither signal can be uncorrelated to the sign value. Because the sign values are uncorrelated, the average over a number of random samples can trend to or toward zero. A product of the sign value and a sum of the specified analog input value and the varying dither signal can average to zero.

Equation 3 shows equation 2 with the term that can be equal to 0 removed. The metastability error can be correlated with the sign value. Equation 3 shows that because the error value and the sign value of the comparator can be correlated (e.g., because the error value switches from positive to negative at the comparator threshold 508), the resulting value can be the absolute value of the metastability error. A product of the metastability error and the sign value can average to an absolute value of the metastability error. The sign value of the metastability error can be recovered (e.g., corrected) by multiplying the metastability error by the comparator sign value.

The shown order of steps is not intended to be a limitation on the order in which the steps are performed. In an example, two or more steps may be performed simultaneously or at least partially concurrently.

Figures 8A, 8B, 8C:
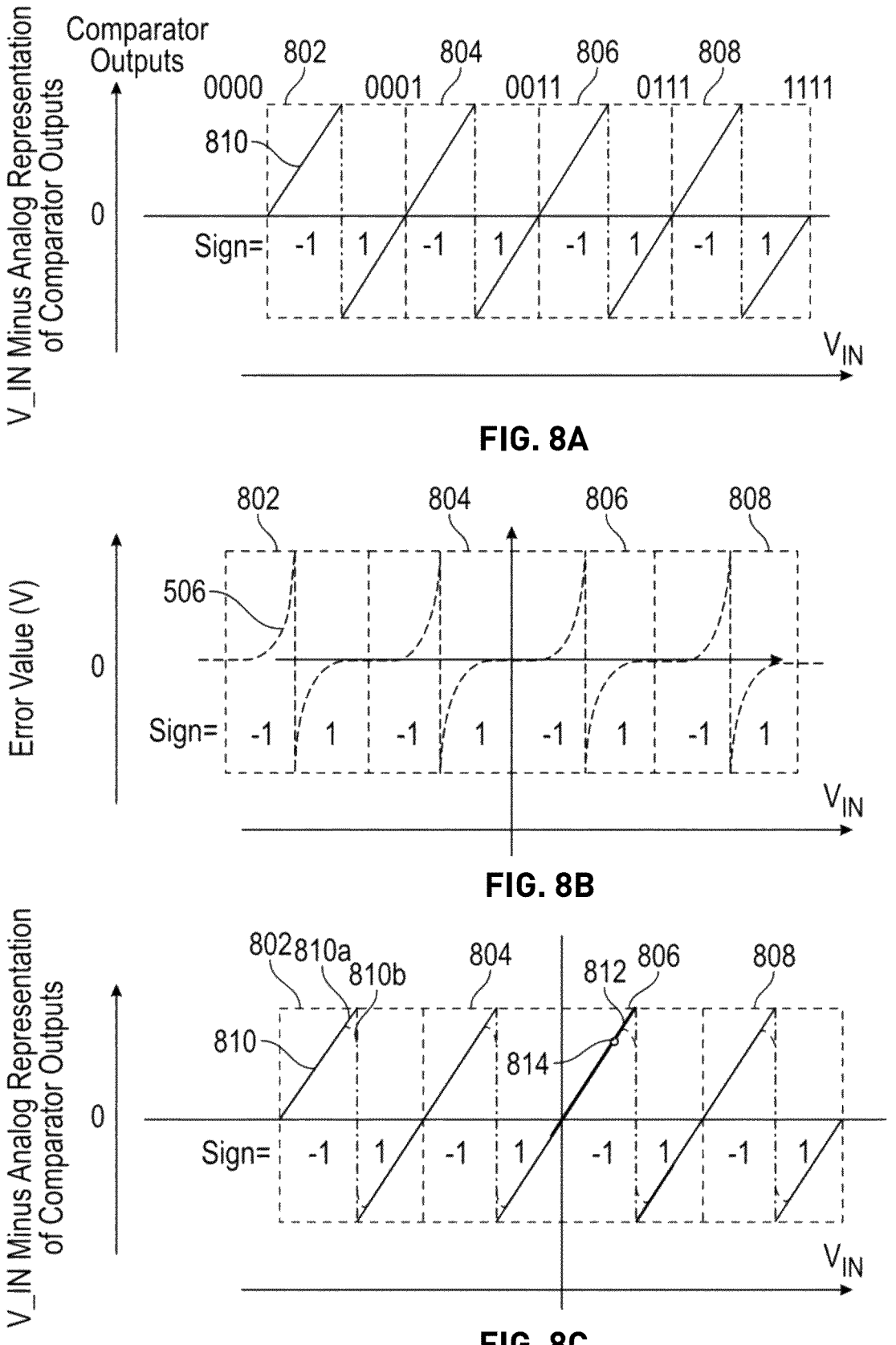
FIG. 8A shows an example of portions of the operation of a sub-ADC.
FIG. 8B shows an example of portions of the metastability error of a sub-ADC.
FIG. 8C shows an example of portions of the input of a sub-ADC, including a varying dither signal.

FIG. 8A shows an example of portions of the operation of a sub-ADC 212. FIG. 8A shows the switching regions for each of the comparators arranged side by side. For example, switching range 802 can correspond to the fourth comparator 308, switching range 804 can correspond to the third comparator 306, switching range 806 can correspond to the second comparator 304, and switching range 808 can correspond to the first comparator 302. FIG. 8A shows the comparator outputs, such as can be converted the binary digital output of the sub-ADC 212. FIG. 8A also shows the sign value (e.g., corresponding to the comparator of the operative switching range).

FIG. 8B shows an example of portions of the metastability error 506 of a sub-ADC 212. FIG. 8B shows that the metastability error 506 can be correlated with the sign value (e.g., the metastability error 506 can be positive when the sign value is negative, and the metastability error 506 can be negative when the sign value is positive). This can result in the equation 3 providing the absolute value of the metastability error 506.

FIG. 8C shows an example of portions of the input 810 of a sub-ADC 212, including a varying dither signal 812. FIG. 8C can show an ideal output 810a (e.g., such as can occur in an ideal ADC) and a actual output 810b (e.g., such as can occur in the residue-generating ADC 100). The ideal output 810a can mirror the input 810. The actual output 810b can reflect a metastability error in the system. The actual output 810b can have a lower absolute value than the ideal output 810a for one or more input voltages. FIG. 8C shows a specified analog input value 814, including a varying dither signal range 812 that can result from the varying dither signal being added or subtracted from the specified analog input value 814 (e.g., the varying dither signal summed with the specified analog input value 814 can result in an analog input somewhere in the varying dither signal range 812). FIG. 8C shows that the varying dither signal can result in the sign value being uncorrelated with the specified analog input value 814 (e.g., for the same specified analog input value 814, sometimes the sign is +1 and sometimes the sign is −1). This can result in the average of the specified analog input value 814 multiplied by the sign being 0, such as discussed above with respect to equation 2.

In an example, the varying dither signal can be configured to be large enough that the specified analog input value 814 is not correlated with the sign value. This can include configuring the varying dither signal to have a specified range, such as a specified percentage of the switching range of the comparators (e.g., ½ of the switching range, ¾ of the switching range, 1 times the switching range, 1¼ of the switching range).

FIG. 9 shows an example of portions of a method 900 for operating a system for adjusting a metastability error in an ADC. One or more portions of the method 900 can be performed by the residue-generating ADC 100, or one or more portions of the method 900 can be performed by another system in conjunction with the residue-generating ADC 100 (e.g., to adjust a metastability error of the residue-generating ADC 100). At step 902, it can be determined whether a comparator in a first stage of the ADC has settled to a determinate binary state at a first time.

At step 904, it can be determined whether the comparator in the first stage of the ADC has settled to the determinate binary state at a second time. The first time can be a first specified time period before the second time. One or more of the first time or the second time can be selected to increase a signal-to-noise ratio of an output of the ADC.

At step 906, an output of the first stage can be adjusted when it is determined that the comparator in the first stage had not settled to the determinate binary state at least one of the first time or the second time. This can include subtracting a first metastability error correction value from the output of the first stage, such as when it is determined that the comparator in the first stage had not settled to the determinate binary state at the first time. The first metastability error correction value can represent a central tendency of the metastability error between the first time and the second time. Step 906 can also include subtracting a second metastability error correction value from the output of the first stage, such as when it is determined that the comparator in the first stage had not settled to the determinate binary state at the second time. The second metastability error correction value can represent a central tendency of the metastability error between the first time and a third time. The third time can represent a time at which the metastability error reaches a maximum or other specified value, such as when a sub-ADC resets.

Figure 10:
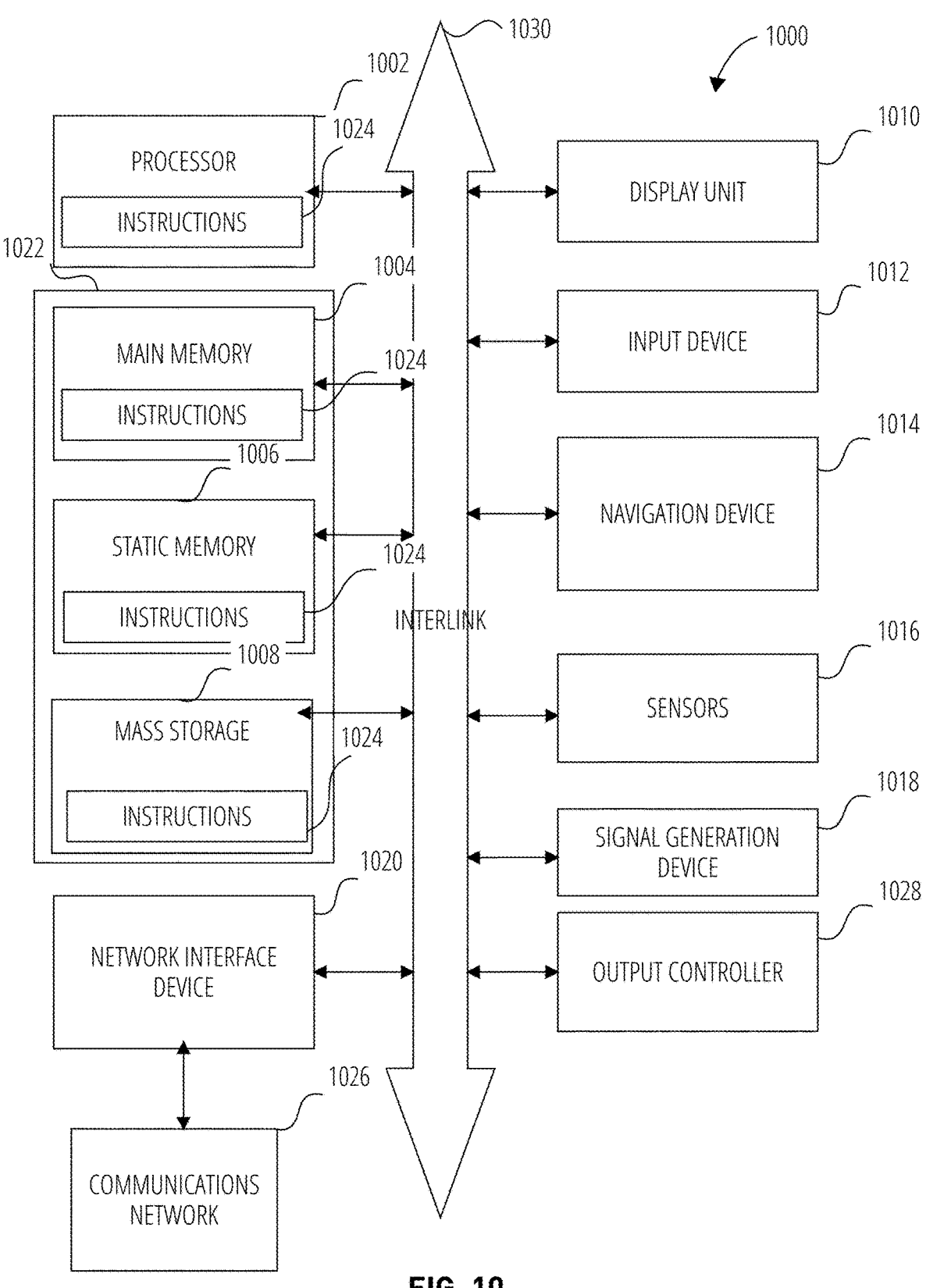
FIG. 10 is a block diagram of an example of portions of a machine upon which one or more portions of the present disclosure may be implemented.

FIG. 10 illustrates a block diagram of an example machine 1000 upon which any one or more of the techniques (e.g., methodologies) discussed herein may be implemented. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative examples, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1000 may include a hardware processor 1002 (e.g., a central processing unit (CPU), a graphics processing unit (GPU), a hardware processor core, or any combination thereof), a main memory 1004, a static memory (e.g., memory or storage for firmware, microcode, a basic-input-output (BIOS), and mass storage 1008 (e.g., hard drives, tape drives, flash storage, or other block devices) some or all of which may communicate with each other via an interlink 1030 (e.g., bus). The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine readable media 1022. While the machine readable medium

1022 is illustrated as a single medium, the term "machine readable medium" may include a single medium or multiple media (e.g., a centralized or distributed database, and/or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine-readable medium.

The following, non-limiting examples, detail certain aspects of the present subject matter to solve the challenges and provide the benefits discussed herein, among others.

EXAMPLES

Example 1 is a system for adjusting a metastability error in an analog-to-digital converter (ADC), the system comprising: a first metastability test circuit, configured to determine whether a comparator in a first stage of the ADC has settled to a determinate binary state at a first time; a second metastability test circuit, configured to determine whether the comparator in the first stage of the ADC has settled to the determinate binary state at a second time, wherein the first time is a first specified time period before the second time; and correction circuitry, configured to adjust an output of the first stage when at least one of the first metastability test circuit or the second metastability test circuit determines that the comparator in the first stage has not settled to the determinate binary state.

In Example 2, the subject matter of Example 1 optionally includes wherein the correction circuitry is configured to: subtract a first metastability error correction value from the output of the first stage when the first metastability test circuit determines that the comparator in the first stage has not settled to the determinate binary state, wherein the first metastability error correction value represents a central tendency of the metastability error between the first time and the second time; and subtract a second metastability error correction value from the output of the first stage when the second metastability test circuit determines that the comparator in the first stage has not settled to the determinate binary state, wherein the second metastability error correction value represents a central tendency of the metastability error between the second time and a third time.

In Example 3, the subject matter of Example 2 optionally includes wherein: at least one of the first time or the second time are selected to increase a signal-to-noise ratio of an output of the ADC.

In Example 4, the subject matter of Example 3 optionally includes wherein: the signal-to-noise ratio for two or more values of the at least one of the first time or the second time are determined using at least one of a computer model or a physical test circuit.

In Example 5, the subject matter of any one or more of Examples 2-4 optionally include wherein the metastability error for a specified analog input value is calculated by: recurrently: applying the specified analog input value to an input of the ADC, wherein the ADC is configured to add a varying dither signal to an analog input and subtract the varying dither signal from a digital output; and recording the digital output value and a sign value of the comparator; and determining a central tendency of a product of the recorded digital output values and the corresponding sign values to determine the metastability error for the specified analog input value.

In Example 6, the subject matter of Example 5 optionally includes wherein: the specified analog input value combined with the varying dither signal is uncorrelated to the sign value; and the metastability error is correlated with the sign value.

In Example 7, the subject matter of Example 6 optionally includes wherein: a product of the sign value and a sum of the specified analog input value and the varying dither signal averages to zero; and a product of the metastability error and the sign value averages to an absolute value of the metastability error.

In Example 8, the subject matter of Example 7 optionally includes wherein the correction circuitry is configured to: multiply the determined central tendency by the sign value to recover a sign of the metastability error.

In Example 9, the subject matter of any one or more of Examples 5-8 optionally include wherein the determined metastability error represents an absolute value of the metastability error, wherein a sign value is assigned to the determined metastability error based on an output of the comparator in the first stage.

In Example 10, the subject matter of any one or more of Examples 1-9 optionally include wherein at least one of the first metastability test circuit or the second metastability test circuit includes: an exclusive or (XOR) gate, connected to both outputs of the comparator, wherein the XOR gate outputs a logical high value when the comparator has settled to the determinate binary state; and a delay flip-flop, configured to capture the output value of the XOR gate based on an input clock signal.

In Example 11, the subject matter of Example 10 optionally includes wherein: the first metastability test circuit and the second metastability test circuit share the XOR gate; the first metastability test circuit includes a first delay flip-flop, configured to capture the output value of the XOR gate based on a first input clock signal; the second metastability test circuit includes a second delay flip-flop, configured to capture the output value of the XOR gate based on a second input clock signal; the first input clock signal is configured to trigger the first delay flip-flop to capture the output value of the XOR gate at the first time; and the second input clock signal is configured to trigger the second delay flip-flop to capture the output value of the XOR gate at the second time.

In Example 12, the subject matter of any one or more of Examples 1-11 optionally include a third metastability test circuit, configured to determine whether the comparator in the first stage of the ADC has settled to the determinate binary state at a fifth time, wherein the fifth time is a second specified time period after the second time, wherein the correction circuitry is configured to adjust the output of the first stage when at least one of the first metastability test circuit, the second metastability test circuit, or the third metastability test circuit determines that the comparator in the first stage has not settled to the determinate binary state.

In Example 13, the subject matter of any one or more of Examples 1-12 optionally include a fourth metastability test circuit, configured to determine whether a comparator in a second stage of the ADC has settled to a determinate binary state at the first time; a fifth metastability test circuit, configured to determine whether the comparator in the first stage of the ADC has settled to the determinate binary state at the second time; and second correction circuitry, configured to adjust an output of the second stage when at least one of the fourth metastability test circuit or the fifth metastability test circuit determines that the comparator in the second stage has not settled to the determinate binary state.

In Example 14, the subject matter of any one or more of Examples 1-13 optionally include wherein the ADC includes a pipelined ADC configuration.

Example 15 is a method for adjusting a metastability error in an analog-to-digital converter (ADC), the method comprising: determining whether a comparator in a first stage of the ADC has settled to a determinate binary state at a first time; determining whether the comparator in the first stage of the ADC has settled to the determinate binary state at a second time, wherein the first time is a first specified time period before the second time; and adjusting an output of the first stage when it is determined that the comparator in the first stage had not settled to the determinate binary state at at least one of the first time or the second time.

In Example 16, the subject matter of Example 15 optionally includes subtracting a first metastability error correction value from the output of the first stage when it is determined that the comparator in the first stage had not settled to the determinate binary state at the first time, wherein the first metastability error correction value represents a central tendency of the metastability error between the first time and the second time; and subtracting a second metastability error correction value from the output of the first stage when it is determined that the comparator in the first stage had not settled to the determinate binary state at the second time, wherein the second metastability error correction value represents a central tendency of the metastability error between the first time and a third time.

In Example 17, the subject matter of Example 16 optionally includes selecting at least one of the first time or the second time to increase a signal-to-noise ratio of an output of the ADC.

In Example 18, the subject matter of any one or more of Examples 16-17 optionally include calculating the metastability error for a specified analog input value by: recurrently: applying the specified analog input value to an input of the ADC, wherein the ADC is configured to add a varying dither signal to an analog input and subtract the varying dither signal from a digital output; and recording the digital output value and a sign value of the comparator; and determining a central tendency of a product of the recorded digital output values and the corresponding sign values to determine the metastability error for the specified analog input value.

In Example 19, the subject matter of Example 18 optionally includes multiplying the determined central tendency by the sign value to recover a sign of the metastability error.

Example 20 is a method for determining a metastability error in an analog-to-digital converter (ADC), the method comprising: calculating the metastability error for a specified analog input value by: recurrently: applying the specified analog input value to an input of the ADC, wherein the ADC is configured to add a varying dither signal to an analog input and subtract the varying dither signal from a digital output; and recording the digital output value and a sign value of a comparator in a first stage of the ADC; and determining a central tendency of a product of the recorded digital output values and the corresponding sign values to determine the metastability error for the specified analog input value.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

What is claimed is:

1. A system for adjusting a metastability error in an analog-to-digital converter (ADC), the system comprising:
   a first metastability test circuit, configured to determine whether a comparator in a first stage of the ADC has settled to a determinate binary state at a first time;
   a second metastability test circuit, configured to determine whether the comparator in the first stage of the ADC has settled to the determinate binary state at a second time, wherein the first time is a first specified time period before the second time; and correction circuitry, configured to adjust an output of the first stage when at least one of the first metastability test circuit or the second metastability test circuit determines that the comparator in the first stage has not settled to the determinate binary state.

2. The system of claim 1, wherein the correction circuitry is configured to:

subtract a first metastability error correction value from the output of the first stage when the first metastability test circuit determines that the comparator in the first stage has not settled to the determinate binary state, wherein the first metastability error correction value represents a central tendency of the metastability error between the first time and the second time; and subtract a second metastability error correction value from the output of the first stage when the second metastability test circuit determines that the comparator in the first stage has not settled to the determinate binary state, wherein the second metastability error correction value represents a central tendency of the metastability error between the second time and a third time.

3. The system of claim 2, wherein:

at least one of the first time or the second time are selected to increase a signal-to-noise ratio of an output of the ADC.

4. The system of claim 3, wherein:

the signal-to-noise ratio for two or more values of the at least one of the first time or the second time are determined using at least one of a computer model or a physical test circuit.

5. The system of claim 2, wherein the metastability error for a specified analog input value is calculated by:

recurrently:

applying the specified analog input value to an input of the ADC, wherein the ADC is configured to add a varying dither signal to an analog input and subtract the varying dither signal from a digital output; and recording the digital output value and a sign value of the comparator; and determining a central tendency of a product of the recorded digital output values and the corresponding sign values to determine the metastability error for the specified analog input value.

6. The system of claim 5, wherein:

the specified analog input value combined with the varying dither signal is uncorrelated to the sign value; and the metastability error is correlated with the sign value.

7. The system of claim 6, wherein:

a product of the sign value and a sum of the specified analog input value and the varying dither signal averages to zero; and a product of the metastability error and the sign value averages to an absolute value of the metastability error.

8. The system of claim 7, wherein the correction circuitry is configured to:

multiply the determined central tendency by the sign value to recover a sign of the metastability error.

9. The system of claim 5, wherein the determined metastability error represents an absolute value of the metastability error, wherein a sign value is assigned to the determined metastability error based on an output of the comparator in the first stage.

10. The system of claim 1, wherein at least one of the first metastability test circuit or the second metastability test circuit includes:

an exclusive or (XOR) gate, connected to both outputs of the comparator, wherein the XOR gate outputs a logical high value when the comparator has settled to the determinate binary state; and a delay flip-flop, configured to capture the output value of the XOR gate based on an input clock signal.

11. The system of claim 10, wherein:

the first metastability test circuit and the second metastability test circuit share the XOR gate;

the first metastability test circuit includes a first delay flip-flop, configured to capture the output value of the XOR gate based on a first input clock signal;

the second metastability test circuit includes a second delay flip-flop, configured to capture the output value of the XOR gate based on a second input clock signal;

the first input clock signal is configured to trigger the first delay flip-flop to capture the output value of the XOR gate at the first time; and the second input clock signal is configured to trigger the second delay flip-flop to capture the output value of the XOR gate at the second time.

12. The system of claim 1, comprising:

a third metastability test circuit, configured to determine whether the comparator in the first stage of the ADC has settled to the determinate binary state at a fifth time, wherein the fifth time is a second specified time period after the second time, wherein the correction circuitry is configured to adjust the output of the first stage when at least one of the first metastability test circuit, the second metastability test circuit, or the third metastability test circuit determines that the comparator in the first stage has not settled to the determinate binary state.

13. The system of claim 1, comprising:

a fourth metastability test circuit, configured to determine whether a comparator in a second stage of the ADC has settled to a determinate binary state at the first time;

a fifth metastability test circuit, configured to determine whether the comparator in the first stage of the ADC has settled to the determinate binary state at the second time; and second correction circuitry, configured to adjust an output of the second stage when at least one of the fourth metastability test circuit or the fifth metastability test circuit determines that the comparator in the second stage has not settled to the determinate binary state.

14. The system of claim 1, wherein the ADC includes a pipelined ADC configuration.

15. A method for adjusting a metastability error in an analog-to-digital converter (ADC), the method comprising:

determining whether a comparator in a first stage of the ADC has settled to a determinate binary state at a first time;

determining whether the comparator in the first stage of the ADC has settled to the determinate binary state at a second time, wherein the first time is a first specified time period before the second time; and adjusting an output of the first stage when it is determined that the comparator in the first stage had not settled to the determinate binary state at at least one of the first time or the second time.

16. The method of claim 15, comprising:

subtracting a first metastability error correction value from the output of the first stage when it is determined that the comparator in the first stage had not settled to the determinate binary state at the first time, wherein the first metastability error correction value represents a central tendency of the metastability error between the first time and the second time; and subtracting a second metastability error correction value from the output of the first stage when it is determined that the comparator in the first stage had not settled to the determinate binary state at the second time, wherein the second metastability error correction value represents a central tendency of the metastability error between the first time and a third time.

17. The method of claim 16, comprising:

selecting at least one of the first time or the second time to increase a signal-to-noise ratio of an output of the ADC.

18. The method of claim 16, comprising:

calculating the metastability error for a specified analog input value by:

recurrently:

applying the specified analog input value to an input of the ADC, wherein the ADC is configured to add a varying dither signal to an analog input and subtract the varying dither signal from a digital output; and recording the digital output value and a sign value of the comparator; and determining a central tendency of a product of the recorded digital output values and the corresponding sign values to determine the metastability error for the specified analog input value.

19. The method of claim 18, comprising;

multiplying the determined central tendency by the sign value to recover a sign of the metastability error.

20. A method for determining a metastability error in an analog-to-digital converter (ADC), the method comprising:

calculating the metastability error for a specified analog input value by:

recurrently:

applying the specified analog input value to an input of the ADC, wherein the ADC is configured to add a varying dither signal to an analog input and subtract the varying dither signal from a digital output; and recording the digital output value and a sign value of a comparator in a first stage of the ADC; and determining a central tendency of a product of the recorded digital output values and the corresponding sign values to determine the metastability error for the specified analog input value.

* * * * *